United States Patent [19]

Gunzelmann et al.

[11] Patent Number: 5,100,867

[45] Date of Patent: Mar. 31, 1992

[54] PROCESS FOR MANUFACTURING WIRE OR STRIP FROM HIGH TEMPERATURE SUPERCONDUCTORS AND THE SHEATHS USED FOR IMPLEMENTING THE PROCESS

[75] Inventors: Karl-Heinz Gunzelmann, Nuremberg, Fed. Rep. of Germany; Reiner Müller, Evora, Portugal; Werner Herkert, Erlangen, Fed. Rep. of Germany; Joachim Grosse, Erlangen, Fed. Rep. of Germany; Günter Tiefel, Fürth, Fed. Rep. of Germany

[73] Assignee: Siemens Aktiengesellschaft, Berlin & Munich, Fed. Rep. of Germany

[21] Appl. No.: 477,970

[22] PCT Filed: Dec. 13, 1988

[86] PCT No.: PCT/DE88/00763

§ 371 Date: Jun. 11, 1990

§ 102(e) Date: Jun. 11, 1990

[87] PCT Pub. No.: WO89/06053

PCT Pub. Date: Jun. 29, 1989

[30] Foreign Application Priority Data

Dec. 15, 1987 [DE] Fed. Rep. of Germany ....... 3742499

[51] Int. Cl.⁵ ............................................. H01L 39/24
[52] U.S. Cl. ........................................ 505/1; 505/739; 505/740; 29/599; 428/595; 428/673; 428/677
[58] Field of Search ............... 428/595, 673, 674, 677; 505/1, 739, 742; 29/599; 72/256, 264, 273.5

[56] References Cited

U.S. PATENT DOCUMENTS

| 4,885,273 | 12/1989 | Sugimoto et al. | 29/599 |
|---|---|---|---|
| 4,952,554 | 8/1990 | Jin et al. | 29/599 |
| 4,962,084 | 10/1990 | deBarbadillo et al. | 505/1 |
| 4,983,574 | 1/1991 | Meyer | 29/599 |
| 4,999,338 | 3/1991 | Wijeyesekera et al. | 505/1 |
| 5,004,722 | 4/1991 | Tallman | 29/599 |
| 5,011,515 | 4/1991 | Ikeda et al. | 29/599 |
| 5,017,553 | 5/1991 | Whitlow et al. | 505/740 |
| 5,030,616 | 7/1991 | Yamamoto et al. | 505/1 |

FOREIGN PATENT DOCUMENTS

| 0281474 | 9/1988 | European Pat. Off. . |
|---|---|---|
| 0282236 | 9/1988 | European Pat. Off. . |
| 0285319 | 10/1988 | European Pat. Off. . |
| 0290331 | 11/1988 | European Pat. Off. . |
| 304094 | 2/1989 | European Pat. Off. . |
| 3721147 | 6/1987 | Fed. Rep. of Germany . |
| 009744 | 1/1990 | Japan . |
| 2715 | 3/1990 | PCT Int'l Appl. ............. 505/739 |

OTHER PUBLICATIONS

Tien, J. K. et al., "Hot Isostatic Pressing (HIP) for the Densification of Oxide Superconductors", Center for Strategic Materials, Columbia University, Aug. 1988.

Mimura, M. et al., Applied Physical Letters, 54(16), pp. 1582-1584, 17 Apr. 1989.

"X-Ray Studies of Helium Quenched BaYCuO", Advanced Ceramic Materials, vol. 2, No. 3B, 1987, pp. 624-631, W. Wong-Ng et al.

"Critical Temperature and Critical Current Density of LaSrCu Oxide Wines", Jap. J. of App. Phys., vol. 26, No. 5, May, 1987, pp. L759-L760, O. Kohno et al.

"Superconducting Wines of High Tc Oxides", Jap. J. App. Phys., vol. 26, 1987, Supplement 26-3, K. Ahmatsu et al.

*Primary Examiner*—W. Dean
*Assistant Examiner*—George Wyszomierski
*Attorney, Agent, or Firm*—Kenyon & Kenyon

[57] ABSTRACT

In a known process, oxide powders derived from the four-component systems yttrium-barium-copper-oxygen or lanthanum-strontium-copper-oxygen are mixed, pressed, sintered, ground and then heat-treated to produce a superconducting material which can be shaped to the desired cross-section. According to the invention, the powder is compacted by isostatic pressing and the blank so obtained is extruded at a temperature $\geq 500°$ C. to form a metallic sheath with a deformation ratio of at least 50%. The extruded blank is then converted to wire or strip. The current-carrying capacity of the high-temperature superconductor is improved by the extrusion and the resulting alignment of the crystallites. The process can be implemented using known high-temperatures superconducting material.

19 Claims, 2 Drawing Sheets

PROCESS FOR MANUFACTURING WIRE OR STRIP FROM HIGH TEMPERATURE SUPERCONDUCTORS AND THE SHEATHS USED FOR IMPLEMENTING THE PROCESS

The invention relates to a method for manufacturing wires or strips from high-temperature superconductors, wherein a superconductive material is prepared from oxidic powders through mixing, compressing, sintering and grinding, as well as through thermal treatment, and is then given the desired cross-section through profiling. If need be, the thermal treatment can also include metallurgical melting steps. In addition, the invention relates to the encasing members that are particularly necessary for the extrusion process.

It is well known to manufacture wires or strips from classic superconductors, particularly such as NbSn alloys. Since the discovery of the new, high-temperature superconductive materials (HTSC) it has already been suggested to process them into wires or strips. For example, prior German Patent Application P 3 721 147.1 proposes first grinding a homogenous, superconductive material to render it finely grained, and then filling suitable encasing members, for example, tubing or pockets made of highly cold-forming metals, with the finely grained material, and then giving the filled encasing members the desired cross-section through cold deformation. Before the encasing member is filled, the process steps grinding, compressing, sintering and heat treatment, in particular, is supposed to be repeated as often as needed until the desired homogeneity and superconductivity of the material is achieved.

What has been problematical for the wires and strips manufactured from high-temperature superconductive materials up until now is the current carrying capacity. Generally, it does not yet meet actual requirements. Usually, the conductive materials available to date are prepared by deforming the powder at room temperature. By this means, one essentially only achieves a compacting of the powder.

The object of the invention is therefore to create a manufacturing process which will improve the current carrying capacity of the wires and/or strips that are produced.

The objective is solved according to the invention by combining the following process steps:
(a) through isostatic compressing, the powder is compacted and a blank is produced;
(b) the blank is extruded at a temperature of $\geq 500°$ C. in a metallic encasing member with a degree of deformation of at least 90%;
(c) subsequently, the extruded blank is processed further into a wire or strip.

According to process step (a) of the invention, before extrusion, the blank can be subjected to an additional heat treatment. The isostatic compressing can be carried out in a cold isostatic process (the so-called CIP process) or also in a hot isostatic process (the so-called HIP process). The extrusion can take place alternatively as a forward, reverse or also as an isostatic extrusion.

The method according to the invention can be carried out with high-temperature superconductive materials based on four-component systems, such as in particular yttrium-barium-copper-oxygen (Y-Ba-Cu-O) or lanthanum-strontium-copper-oxygen (La-Sr-Cu-O), or based on five-component systems, such as in particular bismuth-strontium-calcium-copper-oxygen (Bi-Sr-Ca-Cu-O) or thallium-barium-calcium-copper-oxygen (Tl-Ba-Ca-Cu-O). Practical analyses were performed on Y-Ba-Cu-O materials in particular.

It was discovered within the scope of the invention that one achieves an increase in the current carrying capacity particularly by applying the hot-forming process to high-temperature superconductive materials. This is due to the fact that one succeeds in selectively orientating the crystallites in the extrusion process. Particularly decisive in the case of Y-Ba-Cu-O materials is the existence of the tetragonal phase in the superconductive material with a deformation starting at temperatures of 700° C. According to the publication, "X-Ray Studies of Helium-Quenched $Ba_2YCu_3O_{7-x}$" from ADVANCED CERAMIC MATERIALS, Vol. 2, No. 3B, Special Issue (1987), pp. 624–631, with $0 < X = \delta < 0.5$, in the case of this material, the orthorhombic structure is transformed into the tetragonal structure at approximately 700° C. During the extrusion process at the elevated temperature, there must not be a reaction with the encasing member. This is provided for in particular, by inserting an intermediate layer of a silver foil between the high-temperature superconductive blank and the metallic encasing member, which consists of a copper cover with an adapted steel casing.

It is important in the above connection to initially produce a high-temperature superconductive blank having minimal residual porosity by means of cold or hot isostatic compression, thus making a subsequent extrusion possible. To this end, the powdery base materials are compacted according to the CIP process in a rubber tube at preferably 2000 to 3000 bar, or according to the HIP process in an encasing tube made of silver or silver-coated steel at preferably 900° C. and 2000 bar. Blanks prepared in this manner can be deformed in an encasing member that is suited for extrusion with a degree of deformation of at least 90% in one deformation step. The subsequent further processing to prepare the wires or strips takes place in a well known way by hammering, drawing, and/or rolling.

BRIEF DESCRIPTION OF THE DRAWINGS

Further details and advantages of the invention ensue from the following description of exemplified embodiments in connection with the patent claims, whereby further below, reference is made to the Figures.

EXAMPLE 1

High-temperature superconductive ceramic powder that is already superconductive and is based on the four-component system yttrium-barium-copper-oxide with the stoichiometric composition $YBa_2Cu_3O_{7-\delta}$ and has a distribution of particle size of 10 to 200 $\mu$m is poured into a rubber tube and subjected to cold isostatic compression, the so-called CIP process. The compression takes place at 2500 bar. The blank prepared in this manner is subsequently tempered for 20 hours at 900° C., whereby tempering takes place in an oxygen-containing atmosphere. The blank is then introduced into a metallic encasing member that is suited for extrusion and extruded at 850° C. with a degree of deformation of approximately 90%. This means that a blank with a starting diameter of for example 50 mm is deformed in one deformation step to 14 mm. Next follows a further processing to wires and/or strips, in a well known way, by hammering, drawing, and/or rolling.

EXAMPLE 2

One proceeds according to Example 1, with the tempering operation at 900° C. after the cold isostatic compression eliminated.

EXAMPLE 3

High-temperature superconductive ceramic powder as in Example 1 is poured into an encasing tube made of silver or of silver-coated steel. A hot isostatic compression follows (the so-called HIP process) at 900° C. and at a pressure of about 2000 bar. The blank produced in this manner is subsequently extruded in a deformation step at a temperature of between 800 and 850° C. according to Example 1. The subsequent further processing takes place, again in a well known way, by hammering, drawing, and/or rolling.

EXAMPLE 4

One proceeds according to Example 1, wherein during the cold isostatic compression, a silver core is introduced into the blank. This high-temperature superconductive blank is extruded accordingly in an encasing member and processed further, by which means one is able to produce a silver wire that is provided with a high-temperature superconductive layer.

The extrusion of the high-temperature superconductive blank can take place alternatively as a so-called forward extrusion, reverse extrusion (so-called indirect extrusion) or also as isostatic extrusion. What is decisive is that the crystallites are orientated in the hot-forming process. One must ensure therefore that a suitable encasing member lubricates the extruding die and also guides the blank, so that the deformation is guaranteed without any tearing of the test piece.

In Examples 1 to 4, a copper cover with an adapted steel casing has proven to be particularly suited as an encasing member, wherein the inner side of the steel casing that is facing the high-temperature superconductive blank is provided with a silver layer to prevent any reactions with the ceramic material. The silver layer can be provided by a conventional silver-coating or by inserting a silver foil as an intermediate layer.

Figure 1:
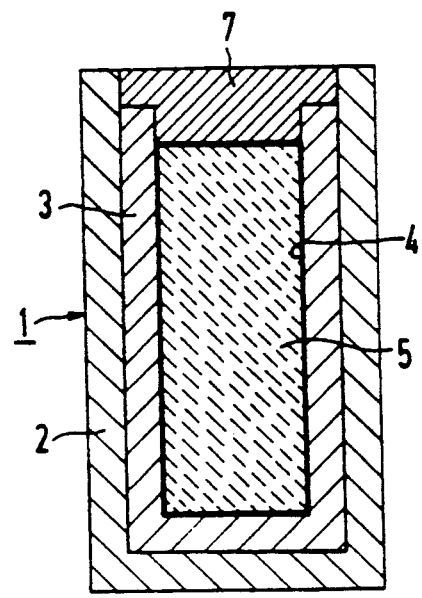
FIG. 1 and FIG. 3 illustrate two differently constructed encasing members with a high-temperature superconductive blank in a transverse representation.

In FIG. 1, such an encasing member for a high-temperature superconductive blank 5 is designated as 1. It consists of a bowl-type copper cover 2, in which is fitted a steel casing 3. On the inner side next to the high-temperature superconductive blank 5, the steel casing has a silver layer 4.

After the blank 5 is introduced into the encasing member 1, this encasing member is closed off by a cover 7. The blank is tapered when it is extruded in an extruding die 10 according to FIG. 2 or FIG. 4. When the degree of deformation is more than 90%, a semifinished product is able to be produced that is suited for further conventional shaping processes.

Figure 3:
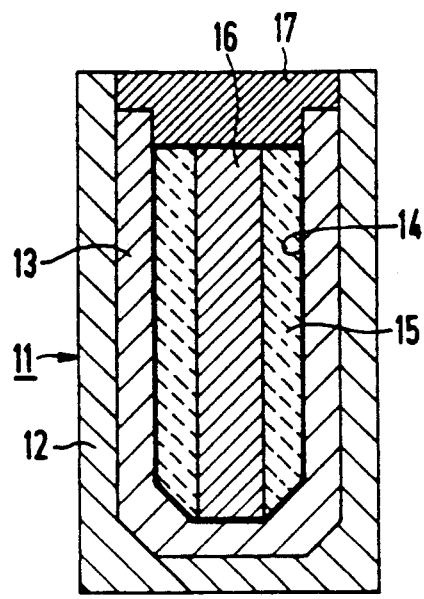

In FIG. 3, an encasing member is designated as 11. It consists according to FIG. 1 of a pocket-like copper cover 12 with a fitted steel casing 13 and a silver layer 14. In the proximal area, the copper cover 12 and the steel casing 13 have a special formation which prevent the cover from tearing during the extrusion process. A silver core 16 is also embedded in the blank. It favorably influences deformability and creates a silver core in the finished wire or strip product. In this manner, the ductility of the finished product is improved.

Figure 2:
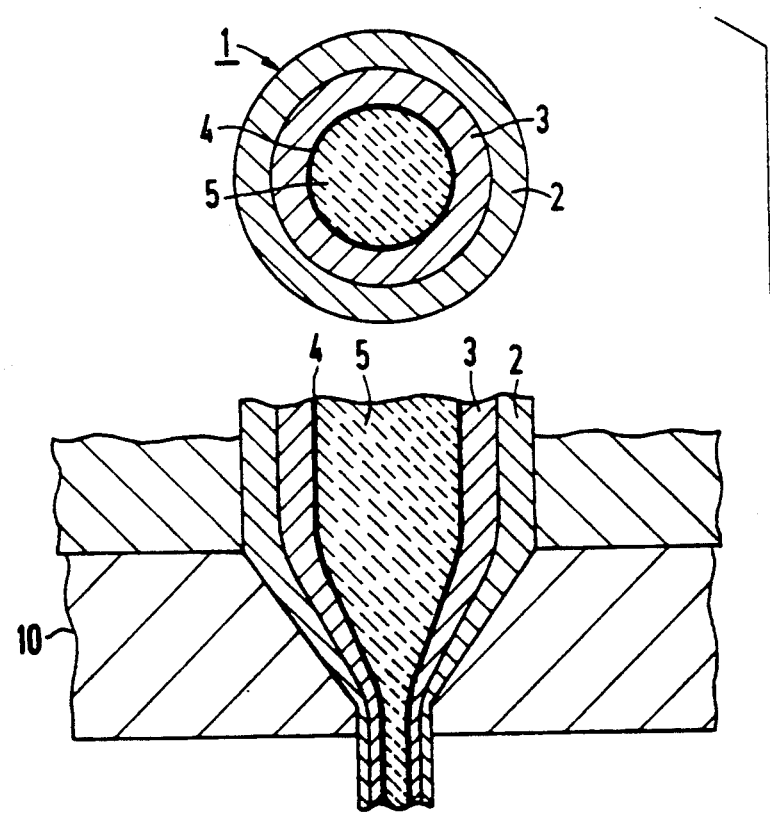
FIG. 2 and FIG. 4 depict respectively the semifinished product formed during extrusion with the corresponding expressed residue.
Figure 4:
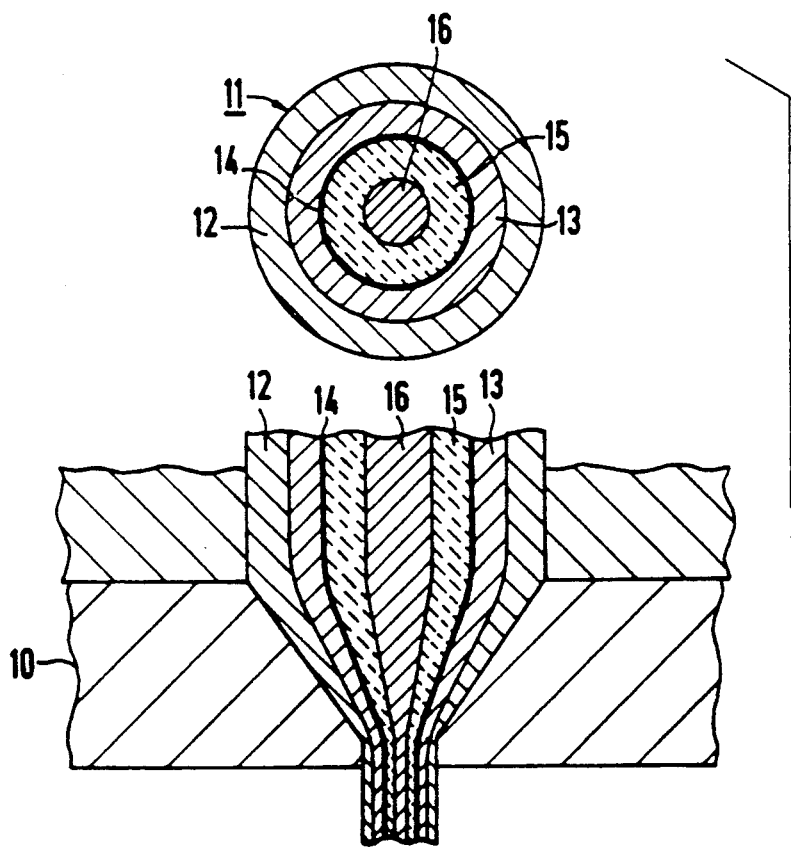

A semifinished product with the high-temperature superconductive areas 5′ or 15′ results from the extrusion process according to FIG. 2 or FIG. 4. After completing the extrusion process or the additional finishing steps, the metallic outer layer can be removed, for example by facing or etching.

Compared to the previously known wires or strips, there is a marked improvement in the attainable current carrying capacity of the wires and strips manufactured according to the described method.

The method according to the invention was described in the examples using the base material $YBa_2Cu_3O_{7-\delta}$. It can also be carried out on other high-temperature superconductive materials. The yttrium can therefore be at least partially replaced by another element from the group of the rare earths. Additional high-temperature superconductive materials are, for example, $Bi_2Sr_2Ca_{n-1}Cu_nO_x$ or $Tl_2Ba_2Ca_{n-1}Cu_nO_y$, $=2$ or 3. The bismuth or the thallium can be partially replaced by lead.

We claim:

1. Method for manufacturing wires or strips form high-temperature superconductors, including preparing superconductive material from oxidic powders, through the steps of mixing, compressing, sintering, grinding and thermal heal treating, and then profiling to provide a desired cross-section, wherein said method further includes the steps of:
   (a) compacting the powder by isostatic compression thereby producing a blank;
   (b) extruding the blank at a temperature of $>500°$ C. within a metallic encasing member with a degree of deformation of at least 90% to form a semifinished product; and
   (c) subsequently processing the semifinished product into a wire or strip.

2. The method according to claim 1, wherein the high-temperature superconductor is a four-component system selected from the group consisting of yttrium-barium-copper-oxygen (Y-Ba-Cu-O) and lanthanum-strontium-copper-oxygen (La-Sr-Cu-O).

3. The method according to claim 1, wherein the high-temperature superconductor is a five-component system selected from the group consisting of bismuth-strontium-calcium-copper-oxygen (Bi-Sr-Ca-Cu-O) and thallium-barium-calcium-copper-oxygen (Tl-Ba-Ca-Cu-O).

4. The method according to claim 1, wherein according to process step (a), a thermal treatment of the blank is carried out before the extrusion.

5. The method according to claim 1 wherein the isostatic compression according to process step (a) is cold isostatic compression which takes place at room temperature in a rubber tube.

6. The method according to claim 5, wherein during the cold isostatic compression, a pressure of between 2000 and 3000 bar is applied.

7. The method according to claim 1 wherein the isostatic compression according to process step (a) is hot isostatic compression which takes place at an elevated temperature below the melting point of the components of the high-temperature superconductive material in a metallic encasing tube.

8. The method according to claim 7, wherein Y-Ba-Cu-O is the high-temperature superconductive material, and wherein the hot isostatic compression takes place at 9. The method according to claim 7, wherein the metallic encasing tube is silver or a silver-coated steel.

10. The method according to claim 1, wherein the extrusion of the blank in the metallic encasing member of step (b) comprises a single deformation step.

11. The method according to claim 10, wherein the extrusion of process step (b) comprises a forward extrusion.

12. The method according to claim 10, wherein the extrusion of process step (b) comprises a reverse extrusion.

13. The method according to claim 10, wherein the extrusion of process step (b) comprises an isostatic extrusion.

14. The method according to claim 10, wherein Y-Ba-Cu-O is the high-temperature superconductive material, wherein the extrusion process is carried out at a temperature of 24 700° C., at which $YBa_2Cu_3O_{7-\delta}$ has a tetragonal structure.

15. An encasing member for extruding a blank of high temperature superconductor material for manufacturing wire or strip from a high temperature superconductor wherein said encasing member holds the blank, said encasing member has an interior side facing the blank, and said encasing member is provided with a silver layer on said interior side facing the blank.

16. An encasing member according to claim 15 wherein said silver layer is a separate silver foil insert.

17. An encasing member according to claim 16 wherein a core of silver is disposed axially in the encasing member.

18. An encasing member according to claim 15 wherein a core of silver is disposed axially in the encasing member.

19. An encasing member according to claim 15 wherein said encasing member comprises a copper shell having a fitted steel casing and a disc cover.

* * * * *